United States Patent [19]

Perego

[11] Patent Number: 5,504,435
[45] Date of Patent: Apr. 2, 1996

[54] TESTING CONTACTOR FOR SMALL-SIZE SEMICONDUCTOR DEVICES

[75] Inventor: Romano Perego, Calco, Italy

[73] Assignee: SGS-Thomson Microelectronics S.r.l., Agrate Brianza, Italy

[21] Appl. No.: 461,022

[22] Filed: Jun. 5, 1995

Related U.S. Application Data

[62] Division of Ser. No. 209,959, Mar. 14, 1994.

[30] Foreign Application Priority Data

Mar. 15, 1993 [EP] European Pat. Off. .............. 93830099

[51] Int. Cl.$^6$ .............................. H01R 23/72; H01F 3/02
[52] U.S. Cl. .............................. 324/755; 439/73; 439/71; 439/331; 361/212
[58] Field of Search .................... 324/755; 361/212, 361/220; 439/73, 71, 331

[56] References Cited

U.S. PATENT DOCUMENTS

| | | | |
|---|---|---|---|
| 4,316,231 | 2/1982 | Michel | 361/212 |
| 4,887,969 | 12/1989 | Abe | 439/73 |

FOREIGN PATENT DOCUMENTS 0295007  12/1988  European Pat. Off. .

OTHER PUBLICATIONS

European Search Report from European Patent Application Serial No. 93830099.3 filed Mar. 15, 1993.

Patent Abstracts of Japan, vol. 15, No. 494 (E–1145) Dec. 13, 1991 & JP–A–32 15 956 (Matsushita Electron Corp.).

*Primary Examiner*—Kenneth A. Wieder
*Assistant Examiner*—Barry C. Bowser
*Attorney, Agent, or Firm*—David M. Driscoll; James H. Morris

[57] ABSTRACT

A testing contactor is provided for testing small-size semiconductor devices with large currents at high frequencies. Each semiconductor device to be tested has a plurality of leads. The testing contactor includes a plurality of first electric contact elements. A first Kelvin contact for a lead is formed of a first electric contact element in contact with the lead. The testing contactor further includes a plurality of second electric contact elements and a plurality of electric connection elements. An electric connection element in contact with the lead effectively extends the lead. A second Kelvin contact is formed of a second electric contact element and an electric connection element, the second electric contact element in contact with the electric connection element and the electric connection element in contact with the lead.

4 Claims, 2 Drawing Sheets

TESTING CONTACTOR FOR SMALL-SIZE SEMICONDUCTOR DEVICES

This application is a division of application Ser. No. 08/209,959, filed Mar. 14, 1994, entitled TESTING CONTACTOR FOR SMALL-SIZE SEMICONDUCTOR DEVICES and now pending.

BACKGROUND OF THE INVENTION

1. Field of the Invention

This invention relates to a testing contactor for semiconductor devices, specifically power devices.

2. Discussion of the Related Art

Semiconductor devices comprise a more or less oblate parallelepipedic body having electrical connection leads. It is common practice to test such devices, prior to shipment, one at a time to check performance specifications. To this end, their leads are connected electrically to an automatic test apparatus which applies predetermined test currents across lead pairs, and measures the voltage drop across the two leads inside the device. Similar tests are performed manually on individual semiconductor devices for design verification, specific sampled quality checks, or other purposes.

Usually, the test current is supplied with the intermediary of a contactor which carries plural electric contact elements spring loaded toward the leads. The voltage drop is measured across these contact elements.

Power devices may require relatively large currents (on the order of some amperes), so the contact resistance between the leads and electric contact elements becomes significant. For this reason, measuring the voltage drop across the electric contact elements, rather than across the lead, produces a measured voltage value made greater by the voltage drop across the two contact resistances. This would distort the test measurements to a largely unforeseeable extent, since contact resistance varies with such uncontrolled factors as pressure, actual contact area, surface finish, ambient temperature, cleanliness, etc.

To eliminate such errors, so-called Kelvin contacts are used. Kelvin contacts are in practice dual contacts placed side-by-side; one contact element (the "forcing" contact) is used to supply current, and the other contact element (the "sensing" contact) is used to transmit the resulting voltage drop and is connected to a voltage meter. The voltage drop due to contact resistance of sensing contacts is negligible because the current flowing through the sensing contacts is very small. However, there are semiconductor devices, including semiconductor power devices that are so small that the Kelvin contacts cannot be used with the contact elements laid side-by-side. It would be possible to press the two contact elements against the lead from opposite sides but this solution is unacceptable because it makes for significantly different pathlengths of the sensing and forcing wires which, in tests conducted at high frequencies, introduces errors.

One object of the invention is to provide a testing contactor which uses Kelvin contacts and which can be used with small-size semiconductor devices, i.e., devices whose leads are less than 5 mm long, less than 1 mm wide, and are spaced less than 2 mm apart.

SUMMARY OF THE INVENTION

These problems are solved, in one embodiment of the present invention, by a testing contactor that includes an electric connection element in contact with each lead of the semiconductor device to be tested, the electric connection element effectively extending the lead.

Each semiconductor device to be tested has a plurality of leads. The testing contactor includes a plurality of first electric contact elements. A first Kelvin contact for a lead is formed of a first electric contact element in contact with a lead. The testing contactor further includes a plurality of second electric contact elements and a plurality of electric connection elements. A second Kelvin contact is formed of a second electric contact element and an electric connection element, the second electric contact element in contact with the electric connection element and the electric connection element in contact with the lead.

Preferably, the electric connection element and the first electric contact element are on opposite sides of the lead so that the first electric contact element and the second electric contact element may be on the same side of the lead. This allows short, matched signal paths supportive of superior high frequency characteristics.

The electric connection elements on the backplate practically form extensions of the leads, thereby enabling the sensing and forcing contacts for each lead to be laid side-by-side.

A contactor so constructed can be used manually or can be incorporated into an automatic test apparatus. For use manually, the plate and backplate are hinged together and provided with a closure means. For use in an automatic test apparatus, the plate is affixed to the test apparatus and the backplate is mounted on a pusher member operative to drive it toward and away from the plate.

The parts in electric contact relationship are advantageously urged toward each other in a resilient fashion. Preferably, the first and second electric contact elements are spring mounted on the plate, whereas the electric connection elements are carried rigidly on the backplate. This simplifies construction.

This makes for easier manufacture of the contactor, because standard available spring-mounted contact elements can be used on the plate, and the backplate, carrying no spring-mounted elements, is a very simple construction.

Some semiconductor devices have leads coplanar with one another and with a base of the semiconductor device to facilitate soldering the leads to printed circuits. To prevent the testing operations from altering this coplanar relationship, the backplate preferably includes a projection for exerting pressure on the base, the projection being substantially coplanar with the electric connection elements.

Further features and advantages of a contactor according to the invention will become more clearly apparent from the following detailed description of a preferred embodiment thereof, given with reference to the accompanying drawings.

DETAILED DESCRIPTION

Figure 1:
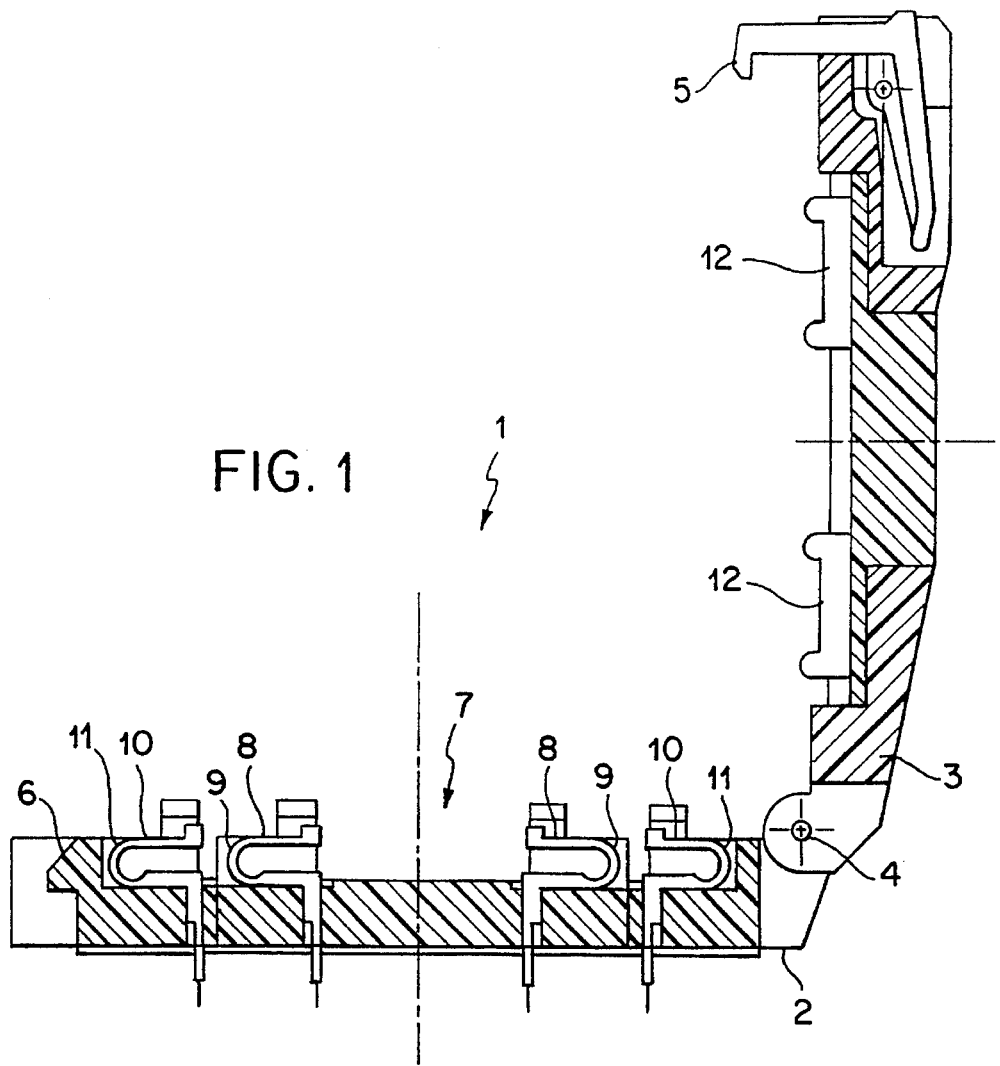
FIG. 1 is a sectional view of a manual contactor according to a first embodiment of the present invention in the open condition.
Figure 2:
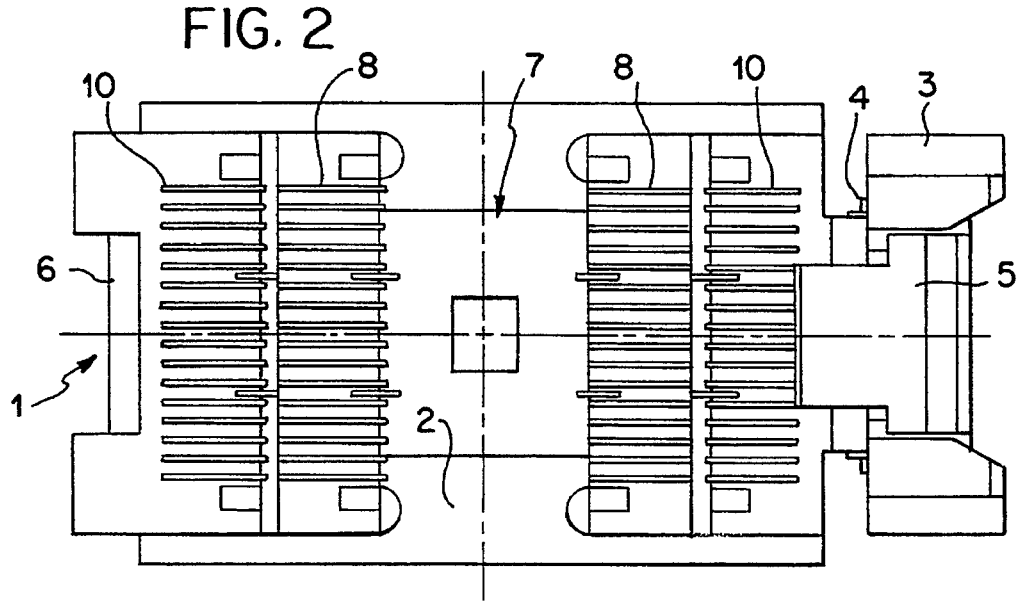
FIG. 2 is a top view of the contactor shown in FIG. 1, again in the open condition.
Figure 3:
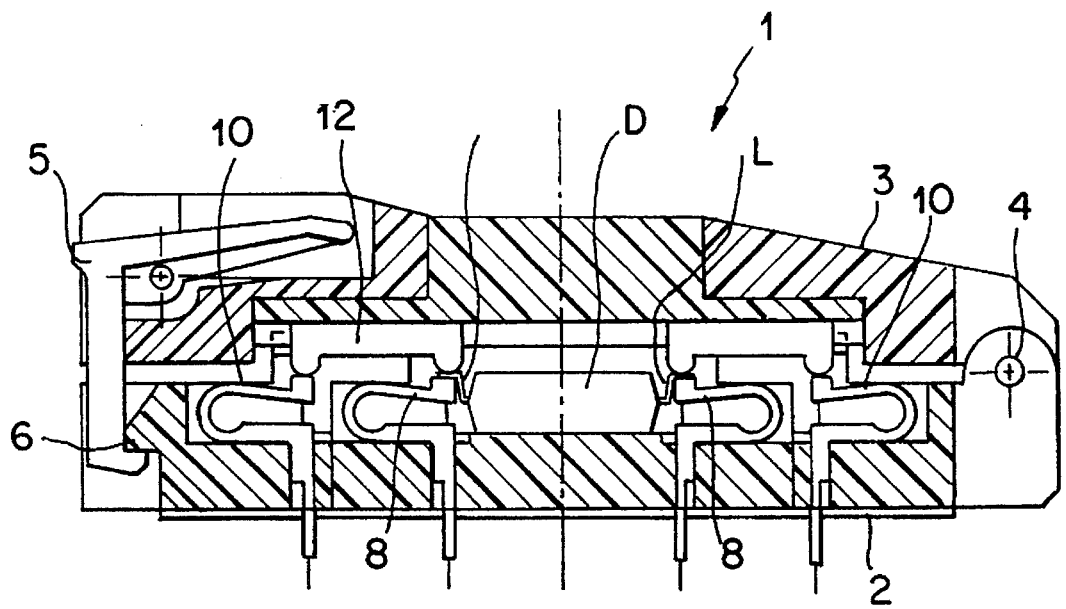
FIG. 3 is a sectional view of the contactor in FIG. 1, shown in the closed condition with a semiconductor device clamped therein.

FIGS. 1 to 3 show a manual contactor 1 for testing a semiconductor device D having a plurality of leads L laid in two arrays along two sides of device D. Contactor 1 comprises a plate 2 and a backplate 3, both made of an electrically insulating material. Plate 2 and backplate 3 are hinged together about a pivot pin 4 and can be held together by hook 5 provided on the backplate 3 engaging with a catch 6 formed on plate 2. Also formed in plate 2, and facing backplate 3, is a cavity (or support portion) 7 for receiving and supporting the device D to be tested.

Accommodated on plate 2 are first electric contact elements 8, laid in two arrays along two sides of cavity 7 at locations which correspond individually to the leads L of the semiconductor device D to be tested. Each electric contact element 8 is spring mounted on plate 2 by means of an arched portion 9 of the contact element 8 itself, and is biased toward a respective one of the leads L of device D when device D is supported within cavity 7. Also accommodated on plate 2 are second electric contact elements 10 laid each alongside one of the first contact elements 8. The contact elements 10 are identical with the contact elements 8 and include likewise an arched spring portion 11.

Accommodated on backplate 3 are electric connection (bridging) elements 12 which are positioned to correspond each to a pair of contact elements 8 and 10, with the backplate 3 closed against plate 2. Connection elements 12 are mounted rigidly on backplate 3.

The aggregate of each first contact element 8 with its associated second contact element 10 and an associated connection element 12 forms a contact of the Kelvin type. Preferably, the first contact element 8 functions as a forcing contact (i.e., for power supply), and the second contact element 10 cooperates with the connection element 12 to function as a sensing contact (i.e., for measuring the voltage drop). The arrangement could be reversed. However, although series contact resistances (i.e., between the second contact elements 10 and the connection elements 12, and between first contact element 8 and the leads L) would not disturb a sensing function because the sensing currents are negligible, series contact resistances would interfere unnecessarily with the forcing function, where the currents involved may be large.

Figure 4:
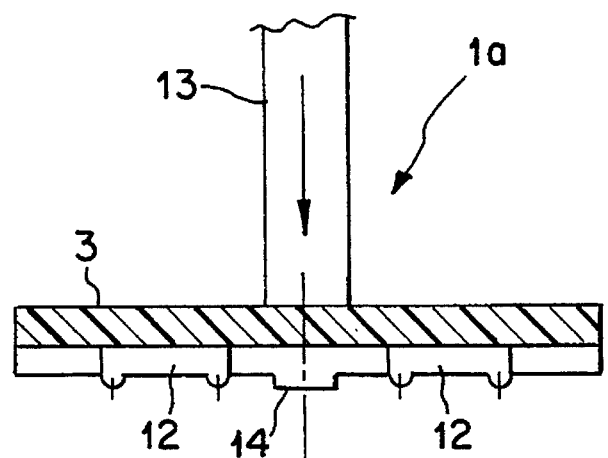
FIG. 4 is a sectional view of a contactor according to a second embodiment of the present invention, for use in an automatic test apparatus.
Figure 4:
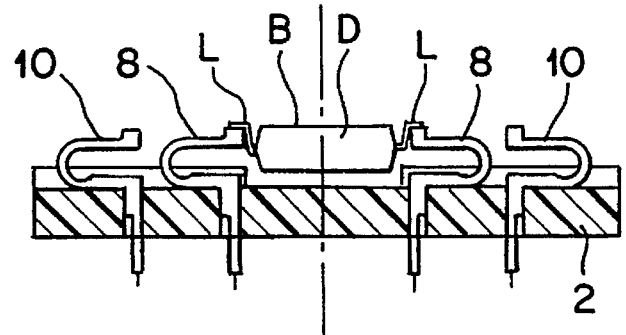

A variation of this invention, shown schematically in FIG. 4, provides a contactor 1a that may be used in an automatic test apparatus (not shown). Contactor 1a differs from contactor 1 essentially in that plate 2 and backplate 3 are independent of rather than hinged to each other. In contactor 1a, plate 2 is mounted fixedly on the testing apparatus, and backplate 3 is mounted on a pusher member (schematically represented by a piston 13 in FIG. 4). The pusher member drives backplate 3 toward and away from plate 2 in synchrony with the delivery to and removal from support portion 7 of devices D for testing.

Some semiconductor devices D have leads L coplanar with one another and with a base B. For such devices it is necessary to maintain this coplanar relationship while testing the device. For these devices, a projection 14 (shown in FIG. 4) may be expediently provided on backplate 3 opposite to a device-support portion of plate 2 between contact elements 8. Projection 14 has a substantially planar surface coplanar with the tips of electric connection elements 12 and device D is laid with the base B against backplate 3. Such a projection, which may be formed on the face of the pusher member of contactor 1a (as shown in FIG. 4), would maintain a coplanar alignment between the surface of base B and leads L.

The use of contactors 1 and 1a can be appreciated from the foregoing. When a semiconductor device D to be tested is placed on the device supporting portion of plate 2, leads L of the device D will bear against the first contact elements 8.

Upon closing the backplate 3 against the plate 2 (manually for contactor 1 or automatically for contactor 1a), each lead L is clamped between a given contact element 8 and a first end of a corresponding connection element 12. Also, the second end of each connection element 12 is urged against a second contact element 10 corresponding to the given contact element 8. As a result, each given first contact element 8 and the corresponding second contact element 10 will become connected electrically to a lead L.

Notice that the electric connection of the first and second contact elements, 8 and 10, occurs on the same side of contactor, 1 (or 1a), specifically on the side next to plate 2. This enables the measurement wires and current supply wires to be substantially the same length, thereby avoiding problems with high-frequency testing.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method for providing Kelvin contacts to a lead of a small-size semiconductor device, the contacts suitable for use in testing the device with large currents at high frequencies, comprising the steps of:

bringing together a first contact element and the lead until the first contact element makes contact with a first point on the lead;

maintaining a predetermined spatial relationship between the first contact element and a second contact element; and bringing together an electric connection element and the lead, the electric connection element having a first end and a second end, until the first end contacts a second point on the lead and the second end contacts the second contact element.

2. A method according to claim 1, wherein the second point is on the opposite side of the lead from the first point 3. A method according to claim 1, wherein bringing together an electric connection element and the lead includes moving the electric connection element in an arc of a circle.

4. A method according to claim 1, wherein bringing together the electric connection element and the lead includes moving the electric connection element in a straight line.

\* \* \* \* \*